United States Patent

Mizuno et al.

[11] Patent Number: 5,840,366
[45] Date of Patent: Nov. 24, 1998

[54] METHOD OF FORMING THIN FILM

[75] Inventors: Shigeru Mizuno; Akihiko Koura, both of Fuchu, Japan

[73] Assignee: Anelva Corporation, Tokyo, Japan

[21] Appl. No.: 520,298

[22] Filed: Aug. 28, 1995

[30] Foreign Application Priority Data

Sep. 9, 1994 [JP] Japan .................................. 6-242201

[51] Int. Cl.$^6$ .................................................. C23C 16/14
[52] U.S. Cl. ........................................... 427/250; 427/253
[58] Field of Search ..................................... 427/250, 253

[56] References Cited

U.S. PATENT DOCUMENTS

| | | | |
|---|---|---|---|
| 4,584,207 | 4/1986 | Wilson ..................................... | 427/253 |
| 4,650,698 | 3/1987 | Moriya et al. ........................... | 427/250 |
| 5,175,017 | 12/1992 | Kobayashi et al. ..................... | 427/255 |
| 5,272,112 | 12/1993 | Schmitz et al. ......................... | 437/192 |
| 5,342,652 | 8/1994 | Foster et al. ............................. | 428/253 |
| 5,387,438 | 2/1995 | Werner et al. ........................... | 427/253 |
| 5,429,991 | 7/1995 | Iwasaki et al. .......................... | 437/192 |
| 5,436,200 | 7/1995 | Tanaka .................................. | 427/255.1 |

*Primary Examiner*—Shrive Beck
*Assistant Examiner*—Bret Chen
*Attorney, Agent, or Firm*—Fay, Sharpe, Beall, Fagan, Minnich & McKee

[57] ABSTRACT

A W film having good surface morphology and high reflectance is formed while avoiding any degradation of the characteristics such as specific resistivity. The method for forming a thin film is carried out by depositing a W film on a heated substrate using CVD. The raw material gas is $WF_6$, and the reducing gases are $SiH_4$ and $H_2$. In the first stage of the film formation, the reaction between $WF_6$ and $SiH_4$ forms nuclei on the surface of the substrate. In the second stage, following the first stage, the reaction between $WF_6$ and $H_2$ forms the W film. The second stage is controlled to form crystal grains of a predetermined size. The first stage and the second stage are alternately repeated as many times as necessary.

14 Claims, 2 Drawing Sheets

METHOD OF FORMING THIN FILM

BACKGROUND OF THE INVENTION

1. Field of the Invention

This invention relates to a method of forming a thin film, and particularly to a method of forming a tungsten thin film by chemical vapor deposition (hereinafter referred to simply as "CVD").

2. Description of Related Art

Recent semiconductor manufacturing technology features an advanced method for the densification and sophistication of integrated circuits. As a result, the load to individual integrated circuits has increased, and various problems have arisen. More precisely the fineness of the wiring pattern induces an increased current density, and electromigration, a type of wire breakage, is likely to occur. In particular, aluminum (Al) film which is presently used as a wiring material is formed by the sputtering method, and the method degrades step coverage in fine hole areas, which inhibits film formation at the bottom and the side wall of the holes and which results in a very thin film on these portions as compared with the film on a flat portion. As a result, wire breakage is further likely to occur on the sidewall surface and thus lowers the reliability of the integrated circuit.

For wiring in such fine hole areas, a tungsten (W) film formed by CVD is currently drawing attention. The W film formed by CVD provides a favorable conformal step coverage even on a fine hole having an aspect ratio of 2 or more, and is advantageous in that it has a high anti-electromigration resistance.

Generally, the CVD process forms a W film by introducing $WF_6$ raw material gas and $H_2$ reducing gas onto a substrate which has been heated to 400° to 500° C., and by reacting these gases. The underlying layer on which the W film is formed on often contains a TiN film. However, it is difficult to generate nuclei during the initial period of the reaction between $WF_6$ and $H_2$ on the TiN film, and results in a non-uniform distribution of the formed film. In that case, normally $SiH_4$ gas is introduced during the initial period of the reaction to generate nuclei on the whole substrate surface based on the reaction between $WF_6$ and $SiH_4$, then high-speed film formation is carried out by the reaction between $WF_6$ and $H_2$.

The W film formed by the above-described conventional method has the problems described below. The W film formed by reacting $WF_6$ and $H_2$ provides the favorable characteristic of step coverage. However, since large crystal grains grow in the W film formation, the W film consisting of the large crystal grains has a rough surface and therefore a poor morphology. As a result, the W film has the disadvantage that the reflectance of the film's surface significantly decreases. This disadvantage causes several serious problems in lithography and etching.

Conventional W-film formation is carried out under a relatively high pressure ranging from several tens of Torr to around atmospheric pressure to improve the surface morphology. By this method, however, the morphology can not be fully improved. It is known that, in addition to applying such a high pressure, when $N_2$ gas is added in the film-forming stage, the surface morphology is further improved. The addition of $N_2$ gas, however, induces an increase in the specific resistivity of the film and increases the wiring resistivity so as to degrade the performance of integrated circuits.

Accordingly, the object of this invention is to provide a method for manufacturing a thin film, enabling the formation of a W film having a good surface morphology and high reflectance while avoiding the degradation of characteristics such as specific resistivity.

SUMMARY OF THE INVENTION

The object of this invention for manufacturing a thin film is to employ a method to deposit a W film on a heated substrate using CVD, wherein the method includes a first step, as the initial stage of film formation, of generating tungsten nuclei on the substrate surface by a reaction between $WF_6$ and $SiH_4$, and a second step, following the nuclei-generating first step, of forming the tungsten film by a reaction between $WF_6$ and wherein $H_2$, and the first step and the second step are alternately repeated.

In the above-described method, in the case that the final thickness of the W film is to be a specified thickness, the total process for forming the W film is divided into a number of unit processes, each unit process consisting of first and second steps, wherein the unit process is repeated for a number of times equal to the number of divided unit processes.

Generally, the growth of a W film by CVD is induced by the mass growth of W-crystal grains. Observing the size of the crystal grains in the W film formed by CVD, the film layer in a thickness range of from 1000 to 2000 Å, for example, consists of fine grains of 500 Å or less. However, the film layer in a thickness range of 2000 Å or more consists of the crystal grain size of larger than 2000 Å. Furthermore, in the film layer having a thickness of 1 μm, for example, the grain size becomes 4000 Å. Accordingly, a feature of the W film is the grain size increases with the growth of the film.

It is presumed that the increase of crystal grain size during the film-growth stage in W-film formation by CVD is induced by the preferential growth of grains in a specific direction of the crystal plane. The formation of fine crystal grains during the initial period of the film-growth stage probably begins with the uniform generation of nuclei on the substrate by the reaction of $WF_6$ and $SiH_4$ occurring in the initial period of the film formation stage.

Based on the above-described concept, this invention is derived by focusing on the formation of fine crystal grains during the initial period of the formation of the W-film growth by CVD, and this invention makes it possible to maintain the fineness of the crystal grains even when the W film increases in thickness by the introduction of a step to generate nuclei during the W-film growth stage.

According to the invention, during the initial period of the film formation stage, the reaction between $WF_6$ and $SiH_4$ is carried out to enable the uniform nuclei generation on the underlying layer TiN, then the growth of the W film is performed through the reaction of $WF_6$ and $H_2$. As the next step, before the W-film growth and before the crystal size increase, the nuclei generation step is again performed through the reaction of $WF_6$ and $SiH_4$, then the W-film growth is carried out by the reaction of $WF_6$ and $H_2$. If necessary, the nuclei generation step and the W-film formation step are repeated several times. By the formation of a thin film following the above-described procedure, the fineness of the crystal grains is maintained even when the thickness of the W film increases to some degree.

DESCRIPTION OF THE PREFERRED EMBODIMENT

This invention is described below referring to embodiments in the examples of film-forming conditions.

EXAMPLE 1

The total thickness of the W film was selected as 1 μm, and the W-film growth of 1 μm thickness was carried out by four operational cycles. Each of the four W-film growth cycles consist of a nuclei-generating step during the initial period of the film formation and a succeeding W-film growth step. The nuclei-generating step was performed by the introduction of $WF_6$ gas at 10 sccm and $SiH_4$ gas at 2 sccm for 10 sec., under an internal pressure of 1.5 Torr. The W-film growth step was carried out through the introduction of $WF_6$ gas at 100 sccm and $H_2$ gas at 1000 sccm for 20 sec., at a substrate temperature of 500° C. and under 40 Torr of internal pressure. The period of the W-film growth was the time necessary for the W-film to reach a thickness of 2500 Å, which was equal to the film thickness large enough to maintain the fineness of the crystal grains. By the film formation following the above-described condition, the surface morphology and reflectance were improved.

EXAMPLE 2

The total thickness of W film was selected to be 4000 Å, and the growth of the W-film thickness was carried out in two operational cycles. Each of the two operational cycles contained a nuclei-generating step in the initial stage of the film formation and a succeeding W-film growth step, similar to Example 1. The conditions of the film formation as the nuclei generation and of the W-film growth as the W-film growth were the same as in Example 1.

Figure 1:
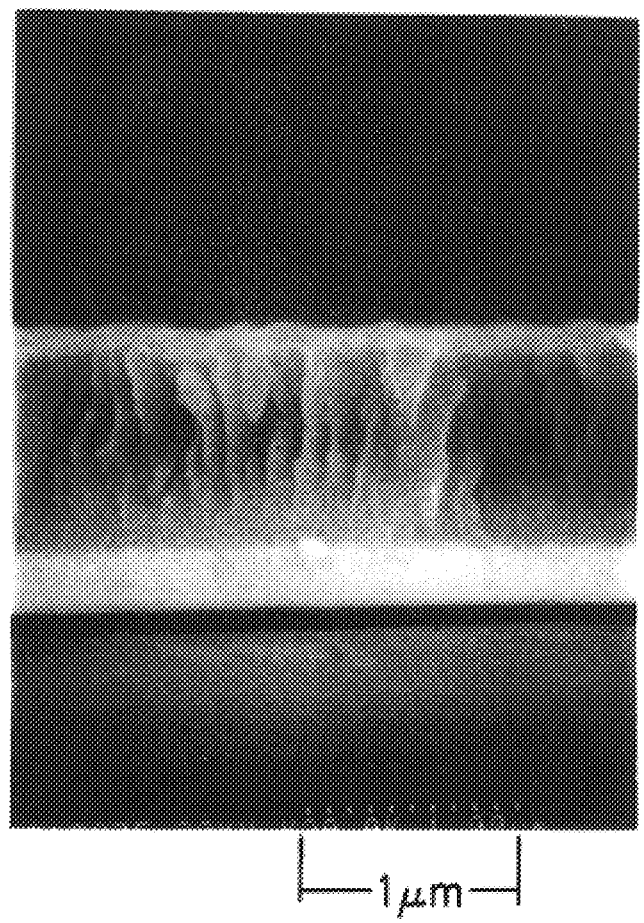
FIG. 1 is a photograph of a cross-section of a thin W film formed on a substrate according to the present invention.
Figure 2:
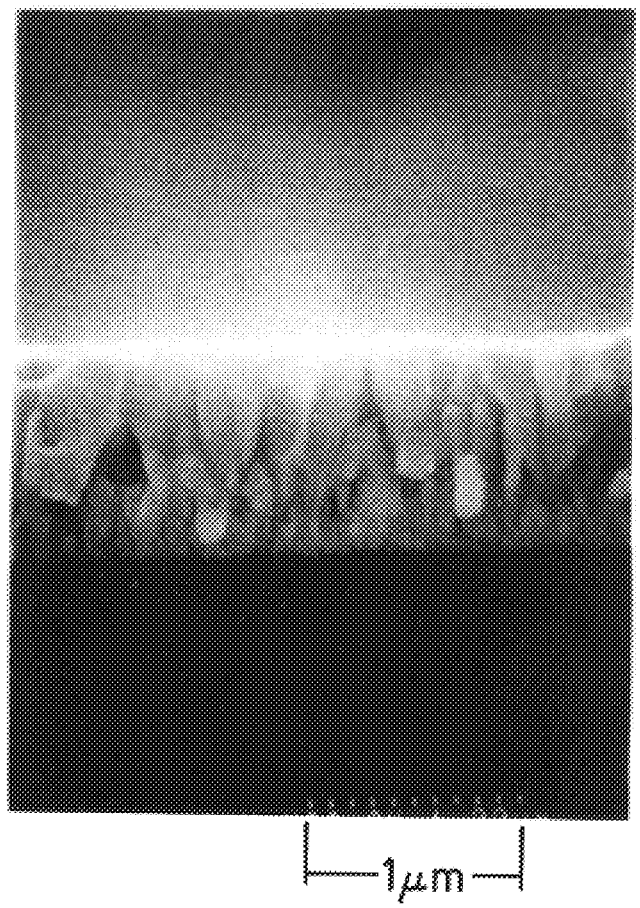
FIG. 2 is a photograph of a cross-section of a thin W film formed on a substrate according to a conventional method.

According to the photograph shown in FIG. 1, it is clear that the W film which was prepared using the method of this invention for forming a thin film maintains the fineness of the crystal grains even after the growth of W film to a thick state. On the contrary, a W film prepared by the conventional thin-film-forming method, which is shown in FIG. 2, clearly gives large crystal grains after the growth of the W film to a thick state. Therefore, the method of this invention for forming a thin film improves the surface morphology. As an example of the characteristics, the W film formed by the method of this invention has a specific resistivity of 9.2 $\mu\Omega$-cm, a reflectance of 85% (vs Si), and a film stress $4.1 \times 10^9$ dyn/cm$^2$, while the film formed by the conventional method has a specific resistivity of 8.7 $\mu\Omega$-cm, reflectance of 45% (vs Si), and a film stress of $4.5 \times 10^9$ dyn/cm$^2$. These characteristics show that the method of this invention improves the reflectance of the film's surface.

With the application of the thin-film-forming method of this invention which has the advantages described above, the step coverage in fine hole areas is improved because the method of this invention decreases the overhanging of the film above the hole compared with the conventional method for forming a thin film. The phenomenon presumably comes from a change which occurs in the growth of crystal grain through the step of forming nuclei during the growth of the W film.

Effect of the Invention

As clearly shown in the description given above, this invention applies the W-film-forming method by CVD, wherein the step for generating nuclei and the step of W-film growth to maintain the fineness of the crystal grains are put together as a single unit-process set and wherein the unit process is repeated as many times as necessary as determined by the target thickness of the W film to be formed. Consequently, the prepared W film has good surface morphology and has high reflectance while the degradation of other characteristics, such as specific resistivity, is avoided.

What is claimed is:

1. A method of forming a tungsten film onto a heated substrate by means of chemical vapor deposition, comprising:

a first step of generating tungsten nuclei by a reaction between $WF_6$ and $SiH_4$ as an initial stage; and a second step of growing said tungsten nuclei to make a tungsten layer so that a crystal grain size thereof is maintained to be a predetermined size, by a reaction between $WF_6$ and $H_2$, as a subsequent stage;

wherein said first and second steps are alternately repeated to deposit said tungsten film onto the heated substrate.

2. A method of forming a tungsten film according to claim 1, wherein a total process for forming said tungsten film is divided into a number of unit processes which respectively include a set of said first and second steps, and said unit process is repeated until a predetermined thickness is obtained.

3. A method of forming a tungsten film onto a heated substrate by means of chemical vapor deposition, comprising:

a nuclei generation step of generating tungsten nuclei by a reaction between $WF_6$ and $SiH_4$; and a tungsten film growth step of growing said tungsten nuclei to make a tungsten layer with a predetermined thickness, in which a crystal grain size thereof is maintained to be a predetermined size, by a reaction between $WF_6$ and $H_2$, wherein the nuclei generation step and the tungsten film growth step are alternately repeated until the tungsten film of a desired thickness is formed.

4. A method of forming a tungsten film according to claim 3, wherein said predetermined thickness of said tungsten layer is in a range of about 1000–2000 Å.

5. A method of forming a tungsten film according to claim 3, wherein a total process for forming said tungsten film is divided into a number of unit processes each of which includes said nuclei generation step and said tungsten film growth step, and said number of unit processes is repeatedly performed in order to deposit said tungsten film onto the heated substrate.

6. A method comprising the steps of:

generating tungsten nuclei by reacting $WF_6$ and $SiH_4$; and forming a tungsten layer by growing said tungsten nuclei by reacting $WF_6$ and $H_2$, wherein the tungsten layer is formed so as not to exceed a predetermined thickness in order to maintain a crystal grain size of the tungsten to be within a desired range and to thereby improve the surface morphology of a tungsten film that is formed.

7. A method according to claim 6, wherein the steps of generating tungsten nuclei and forming a tungsten layer are repeated in order to form the tungsten film to a desired thickness.

8. A method according to claim 7, wherein the resulting tungsten film has a reflectance of at least 85%.

9. A method according to claim 8, wherein the predetermined thickness is 2000 Å.

10. A method according to claim 7, wherein the step of generating tungsten nuclei is accomplished by reacting $WF_6$ gas at about 10 sccm with SiH$_4$ gas at about 2 sccm for approximately 10 seconds at a pressure of approximately 1.5 Torr.

11. A method according to claim 10, wherein the step of forming a tungsten layer is accomplished by reacting WF$_6$ gas at about 100 sccm with H$_2$ gas at about 1000 sccm for approximately 20 seconds at a pressure of approximately 40 Torr.

12. A method according to claim 11, wherein the resulting tungsten film has a reflectance of at least 85%.

13. A method according to claim 12, wherein the predetermined thickness is 2000 Å.

14. A method according to claim 8, wherein the predetermined thickness is 2000 Å.

* * * * *